United States Patent
Bilski, Jr. et al.

(10) Patent No.: US 10,349,557 B2
(45) Date of Patent: Jul. 9, 2019

(54) ELECTRONICS RACK WITH COMPLIANT HEAT PIPE

(71) Applicant: Thermal Corp., Wilmington, DE (US)

(72) Inventors: Walter John Bilski, Jr., Mohnton, PA (US); Sidrit Kosta, Philadelphia, PA (US)

(73) Assignee: Thermal Corp., Wilmington, DE (US)

( * ) Notice: Subject to any disclaimer, the term of this patent is extended or adjusted under 35 U.S.C. 154(b) by 0 days.

(21) Appl. No.: 15/441,807

(22) Filed: Feb. 24, 2017

(65) Prior Publication Data

US 2017/0245392 A1    Aug. 24, 2017

Related U.S. Application Data

(60) Provisional application No. 62/299,336, filed on Feb. 24, 2016.

(51) Int. Cl.
  *H05K 7/20* (2006.01)
(52) U.S. Cl.
  CPC ..... *H05K 7/20336* (2013.01); *H05K 7/20409* (2013.01); *H05K 7/20509* (2013.01); *H05K 7/20663* (2013.01)
(58) Field of Classification Search
  CPC ........... H05K 7/20336; H05K 7/20409; H05K 7/20509; H05K 7/20663; H05K 7/20418; H05K 7/2069; H05K 7/20545; H05K 7/1489
  USPC ....................................................... 361/725
  See application file for complete search history.

(56) References Cited

U.S. PATENT DOCUMENTS

| | | | |
|---|---|---|---|
| 6,515,822 B1 | 2/2003 | White et al. | |
| 6,615,993 B1 | 9/2003 | Rudiger | |
| 7,012,807 B2 * | 3/2006 | Chu | G06F 1/20 165/104.33 |
| 7,133,283 B2 | 11/2006 | Faneuf et al. | |
| 7,180,734 B2 | 2/2007 | Jing | |

(Continued)

FOREIGN PATENT DOCUMENTS

CN    103058089 A    4/2013

OTHER PUBLICATIONS

Notice of Allowance from the U.S. Appl. No. 15/441,792 dated Mar. 28, 2018 (12 pages).

*Primary Examiner* — Mukundbhai G Patel
(74) *Attorney, Agent, or Firm* — Michael Best & Friedrich LLP

(57) ABSTRACT

An electronics rack comprising a first cage, a first heat sink positioned at a rear and in thermal communication with the first cage, a second cage positioned above the first cage, and a second heat sink in thermal communication with the second cage. In another aspect, the present invention provides an electronics rack comprising a frame, a cage, a heat sink positioned at a rear of the frame, and a compliant thermal collector operatively positioned between the cage and the heat sink. The compliant thermal collector can comprise a heat pipe having a non-linear shape that facilitates flexing of the heat pipe to change the length of the thermal collector. The thermal collector advantageously includes a plurality of heat pipes and a contact bar coupling the plurality of heat pipes. Preferably, the rack further includes an adjusting mechanism (e.g., threaded rods) for adjusting a position of the contact bar.

43 Claims, 12 Drawing Sheets

(56) References Cited

U.S. PATENT DOCUMENTS

| | | | |
|---|---|---|---|
| 7,233,491 B2 * | 6/2007 | Faneuf | H05K 7/20809 165/80.4 |
| 7,355,852 B2 | 4/2008 | Pfahnl | |
| 7,460,367 B2 * | 12/2008 | Tracewell | H05K 7/20672 165/104.21 |
| 7,619,897 B2 | 11/2009 | Della Fiora et al. | |
| 7,639,499 B1 | 12/2009 | Campbell et al. | |
| 7,839,640 B2 | 11/2010 | Hayashi et al. | |
| 7,876,525 B2 | 1/2011 | Wilkin et al. | |
| 7,907,409 B2 | 3/2011 | Wyatt et al. | |
| 7,946,639 B2 | 5/2011 | Bridges et al. | |
| 8,130,497 B2 | 3/2012 | Kondo et al. | |
| 8,170,724 B2 | 5/2012 | Kelley et al. | |
| 8,376,479 B2 | 2/2013 | Furey et al. | |
| 8,582,299 B1 | 11/2013 | Phillips et al. | |
| 8,594,857 B2 | 11/2013 | Lin et al. | |
| 8,599,559 B1 | 12/2013 | Morrison et al. | |
| 8,644,024 B2 | 2/2014 | Chen | |
| 8,654,532 B2 | 2/2014 | Chen et al. | |
| 8,743,562 B2 | 6/2014 | Hartman et al. | |
| 8,885,335 B2 | 11/2014 | Magarelli | |
| 8,934,245 B2 * | 1/2015 | Yoshikawa | H01L 23/427 165/104.33 |
| 8,951,000 B2 | 2/2015 | McIntosh et al. | |
| 8,959,941 B2 | 2/2015 | Campbell et al. | |
| 9,380,728 B1 * | 6/2016 | Dunwoody | H05K 7/20709 |
| 9,706,688 B2 | 7/2017 | Smith et al. | |
| 2002/0012236 A1 | 1/2002 | DiMarco | |
| 2006/0102575 A1 | 5/2006 | Mattlin et al. | |
| 2007/0120386 A1 | 5/2007 | Benysh et al. | |
| 2007/0201210 A1 | 8/2007 | Chow et al. | |
| 2008/0056867 A1 | 3/2008 | Zuckerman | |
| 2008/0278912 A1 * | 11/2008 | Zavadsky | H04Q 1/02 361/697 |
| 2009/0159241 A1 | 6/2009 | Lipp et al. | |
| 2009/0161312 A1 | 6/2009 | Spearing et al. | |
| 2011/0013363 A1 | 6/2011 | Goldrian et al. | |
| 2011/0317367 A1 | 12/2011 | Campbell et al. | |
| 2012/0080984 A1 | 4/2012 | Watts | |
| 2013/0264026 A1 | 10/2013 | Eckberg et al. | |
| 2014/0071616 A1 | 3/2014 | Watanabe et al. | |
| 2014/0085808 A1 | 3/2014 | Tung et al. | |
| 2014/0124168 A1 | 5/2014 | Dean et al. | |
| 2014/0146465 A1 | 5/2014 | Wei | |
| 2014/0268548 A1 | 9/2014 | Rice et al. | |
| 2014/0286737 A1 | 9/2014 | Yang et al. | |
| 2015/0048950 A1 | 2/2015 | Zeighami et al. | |
| 2015/0109735 A1 | 4/2015 | Campbell et al. | |
| 2015/0382508 A1 * | 12/2015 | Tatta | H05K 7/20409 361/716 |
| 2016/0088776 A1 | 3/2016 | Cornes et al. | |
| 2017/0245396 A1 | 8/2017 | Bilski, Jr. et al. | |
| 2017/0257966 A1 | 9/2017 | Rozzi et al. | |

* cited by examiner

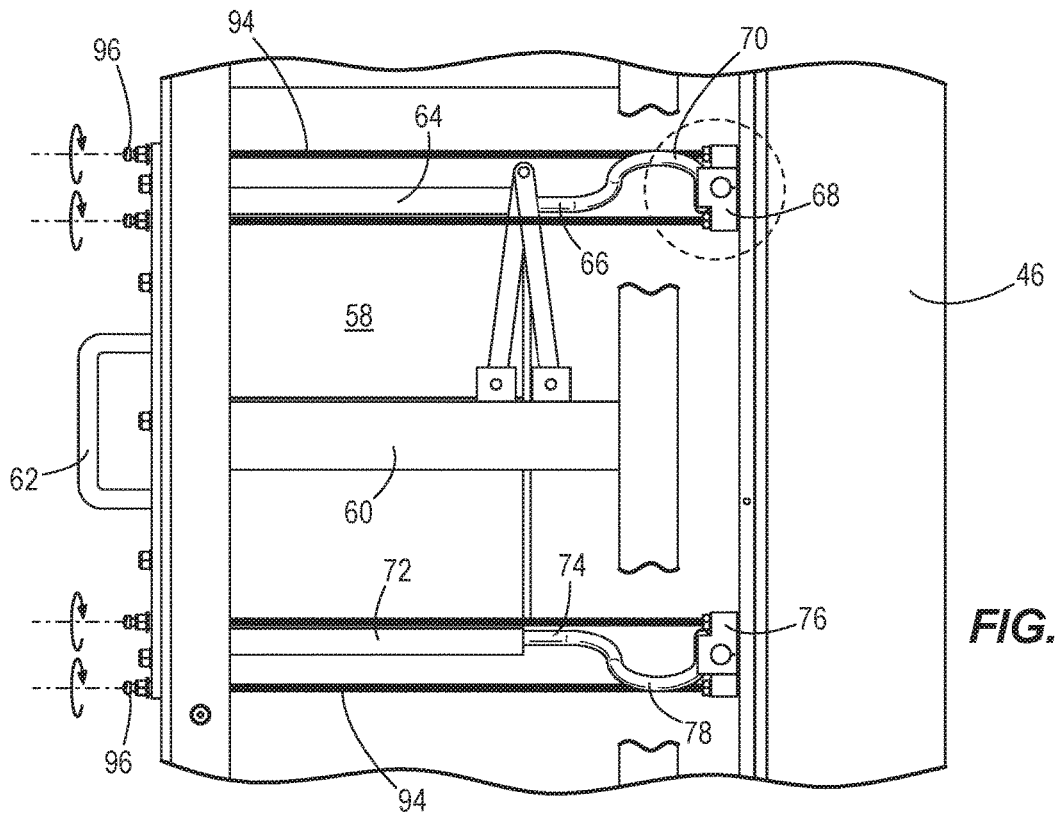
*FIG. 4*
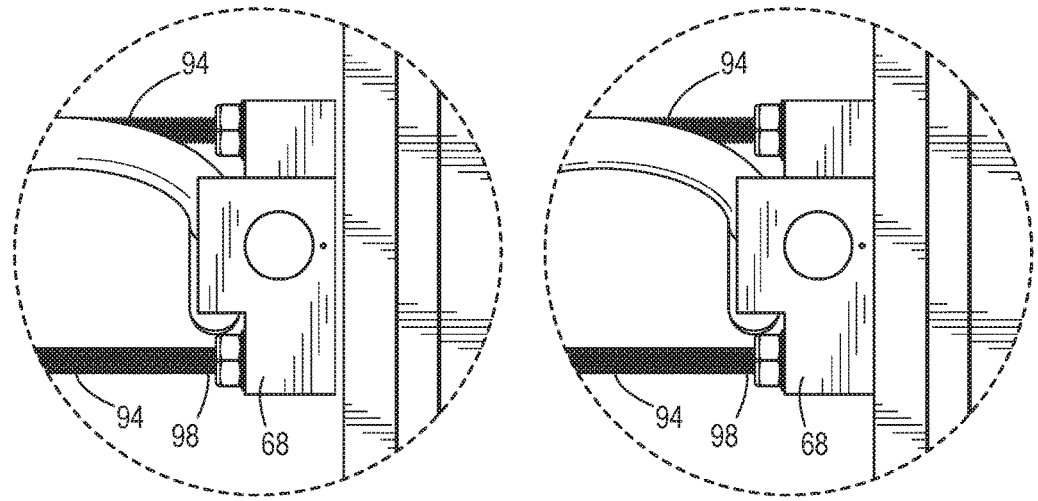
*FIG. 5*   *FIG. 6*

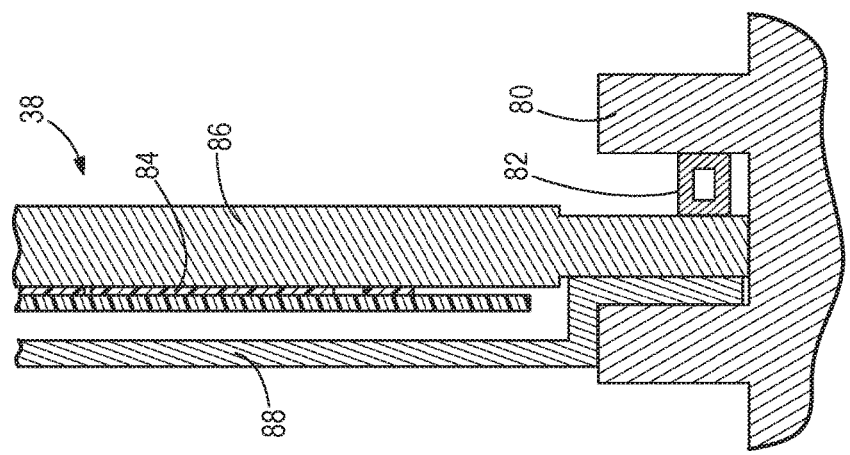
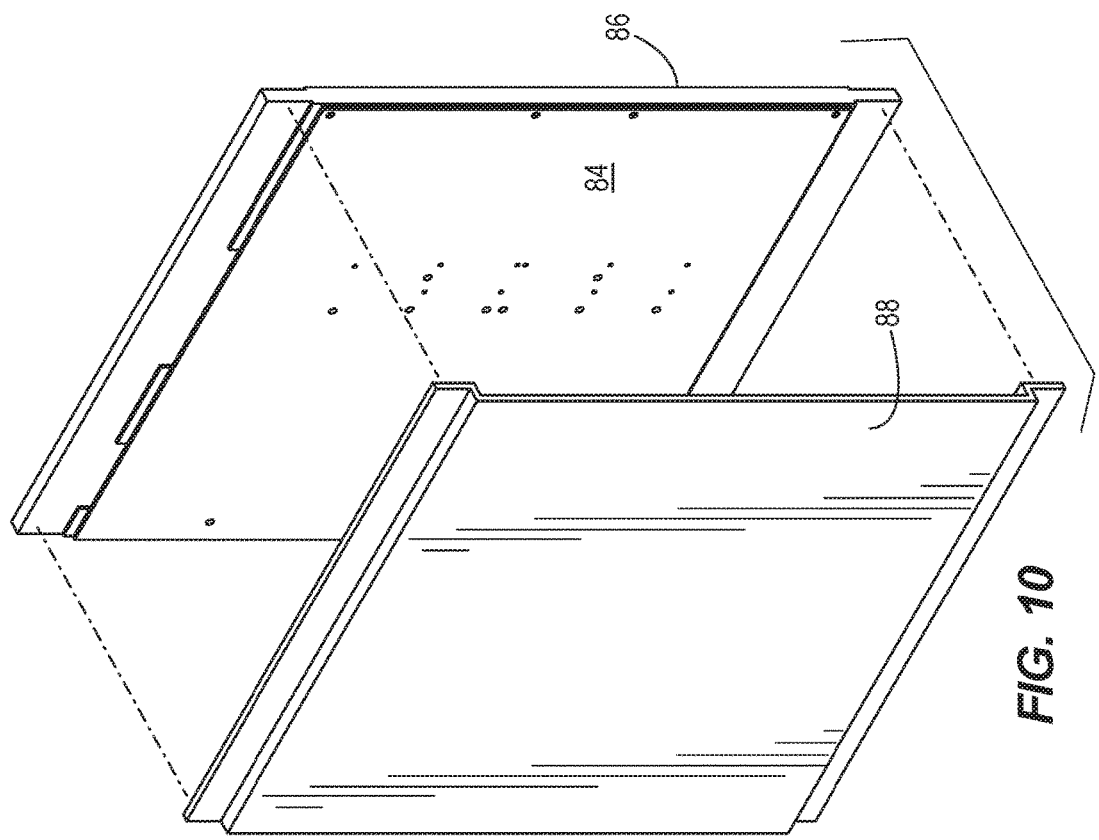

ELECTRONICS RACK WITH COMPLIANT HEAT PIPE

CROSS-REFERENCE TO RELATED APPLICATIONS

This patent application claims priority to U.S. patent application No. 62/299,336 filed on Feb. 24, 2016, the entire contents of which are incorporated herein by reference.

FEDERALLY SPONSORED RESEARCH

This invention was made with government support under purchase order number 7016038 awarded by Bechtel Marine Propulsion Corporation (BMPC)—Knolls Atomic Power Laboratory (KAPL). The government has certain rights in the invention.

BACKGROUND

In many electronic systems, the efficient cooling of electronic components and other heat sources has become a significant problem. With the advent of large-scale integrated circuit (IC) modules containing many thousands of circuit elements, it has become possible to pack large numbers of electronic components together within a very small volume. These integrated circuit modules generate significant amounts of heat during the course of their normal operation. Since most solid state devices are sensitive to excessive temperatures, a solution to the problem of the generation of heat by large scale IC's in close proximity to one another has become of increasing concern in the industry.

Current heat transfer systems have proven to be inadequate for removing the high levels of heat generated by heat sources at a low enough thermal resistance and at a sufficiently fast rate. Thus, there has developed a need to more efficiently remove heat from electronics systems.

SUMMARY

In one aspect, the present invention provides an electronics rack comprising a first cage adapted to support a first electronic component, a first heat sink positioned at a rear of the first cage and in thermal communication with the first cage (e.g., substantially vertically-oriented behind the first cage), a second cage adapted to support a second electronic component and positioned above the first cage, and a second heat sink separate from the first heat sink and in thermal communication with the second cage (e.g., substantially horizontally-oriented above the second cage). Each cage preferably facilitates insertion and removal of a plurality of electronic components from the front. In one embodiment, the electronic cabinet comprises a plurality of first cages arranged in a vertical stack, and the first heat sink is in thermal communication with the plurality of first cages. The second cage can comprise a cooling brick having a plurality of slots adapted to support upper edges of a plurality of vertically-oriented electronic boards, and the cooling brick can include a transverse heat pipe positioned above the plurality of slots.

In another aspect, the present invention provides an electronics rack comprising a frame defining a front and a rear, a cage adapted to support an electronic component, a heat sink positioned at a rear of the frame, and a compliant thermal collector operatively positioned between the cage and the heat sink. The thermal collector is strained between the cage and the heat sink when the cage is in a closed position to thereby provide thermal communication between the cage and the heat sink when the cage is in the closed position. In one embodiment, the compliant thermal collector comprises a heat pipe having a non-linear shape (e.g., including a curved portion). The non-linear shape facilitates flexing of the heat pipe to change the length of the thermal collector.

The thermal collector advantageously includes a plurality of heat pipes and a contact bar coupling the plurality of heat pipes, wherein the contact bar is pressed into contact with the heat sink. Preferably, the rack further includes an adjusting mechanism (e.g., including a threaded rod) for adjusting a position of the contact bar relative to the heat sink.

Other aspects of the invention will become apparent by consideration of the detailed description and accompanying drawings.

BRIEF DESCRIPTION OF THE DRAWINGS

FIG. 4 is a partial side view of the electronics rack of FIG. 2.

FIG. 5 is an enlarged view of the circled portion of FIG. 4 and showing an upper contact bar spaced from a rear heat sink.

FIG. 6 is the view of FIG. 5 with the upper contact bar moved into contact with the rear heat sink.

FIG. 10 is a partially exploded view of the PCB assembly from FIG. 9.

FIG. 11 is a section view of the assembled PCB assembly take at line 11-11 in FIG. 9.

DETAILED DESCRIPTION

Before any embodiments of the invention are explained in detail, it is to be understood that the invention is not limited in its application to the details of construction and the arrangement of components set forth in the following description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising" or "having" and variations thereof herein is meant to encompass the items listed thereafter and equivalents thereof as well as additional items. The terms "mounted," "connected" and "coupled" are used broadly and encompass both direct and indirect mounting, connecting and coupling. Further, "connected" and "coupled" are not restricted to physical or mechanical connections or couplings, and can include electrical connections or couplings, whether direct or indirect.

Figure 1:
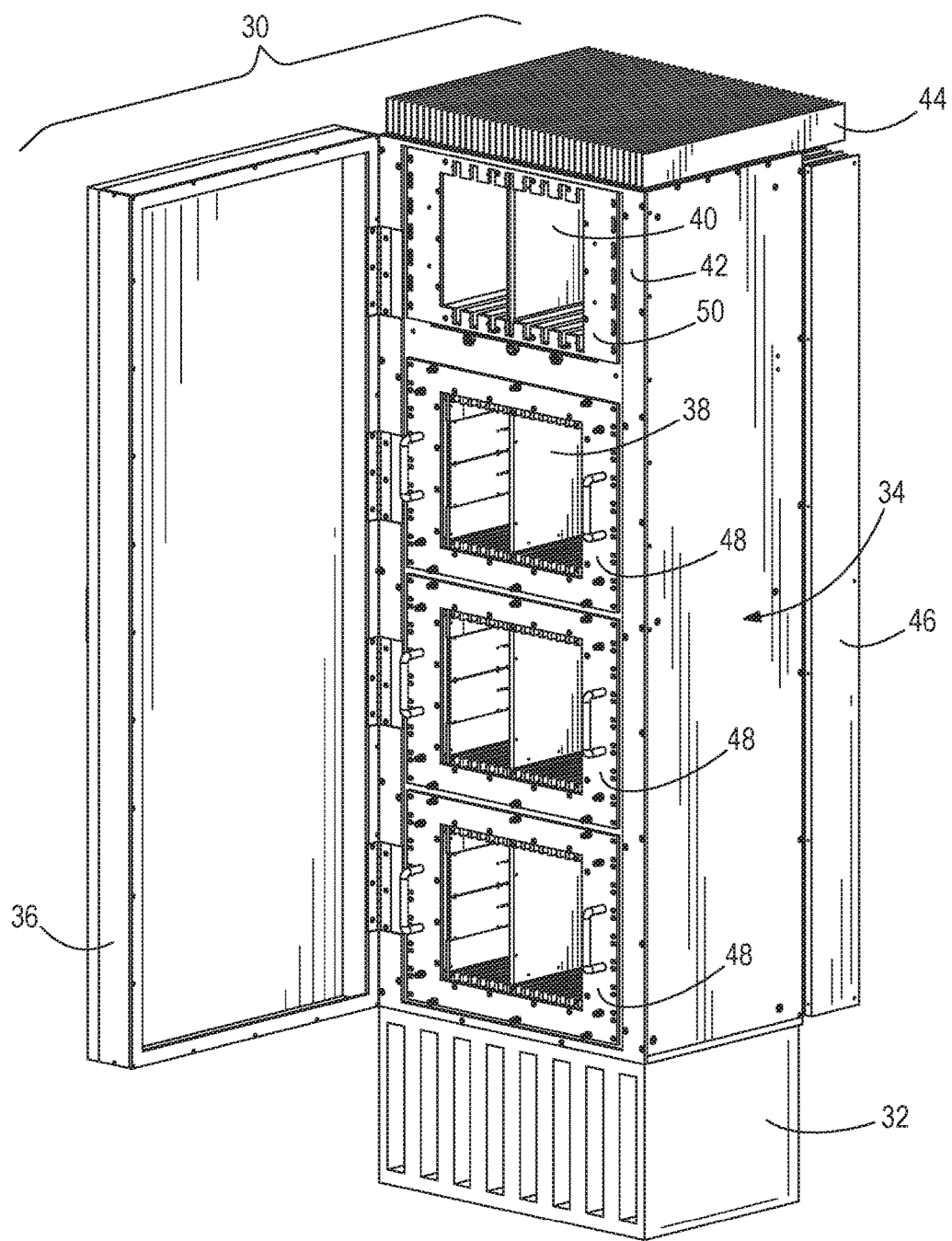
FIG. 1 is a perspective view of an electronics rack embodying the present invention.

FIG. 1 illustrates an electronics cabinet 30 positioned on a base 32. The cabinet 30 includes a rack 34 and a door 36 hinged to the rack 34. The cabinet 30 is designed to receive multiple printed circuit board (PCB) assemblies 38 and multiple power supply assemblies 40, as described below in more detail.

The rack 34 includes a frame 42, a substantially horizontally oriented upper heat sink 44 positioned above and supported by the frame 42, a substantially vertically oriented rear heat sink 46 positioned behind the frame 42, and a plurality of lower and upper cages 48,50 slidable into and out of the frame 42. In the illustrated embodiment, there are a total of four cages—three lower cages 48 and one upper cage 50. The three lower cages 48 in FIG. 1 are each adapted to support a plurality of the PCB assemblies 38 (only one PCB assembly is shown in each lower cage in FIG. 1), and the upper cage 50 in FIG. 1 is adapted to support a plurality of power supply assemblies 40, as described below in more detail.

Figure 2:
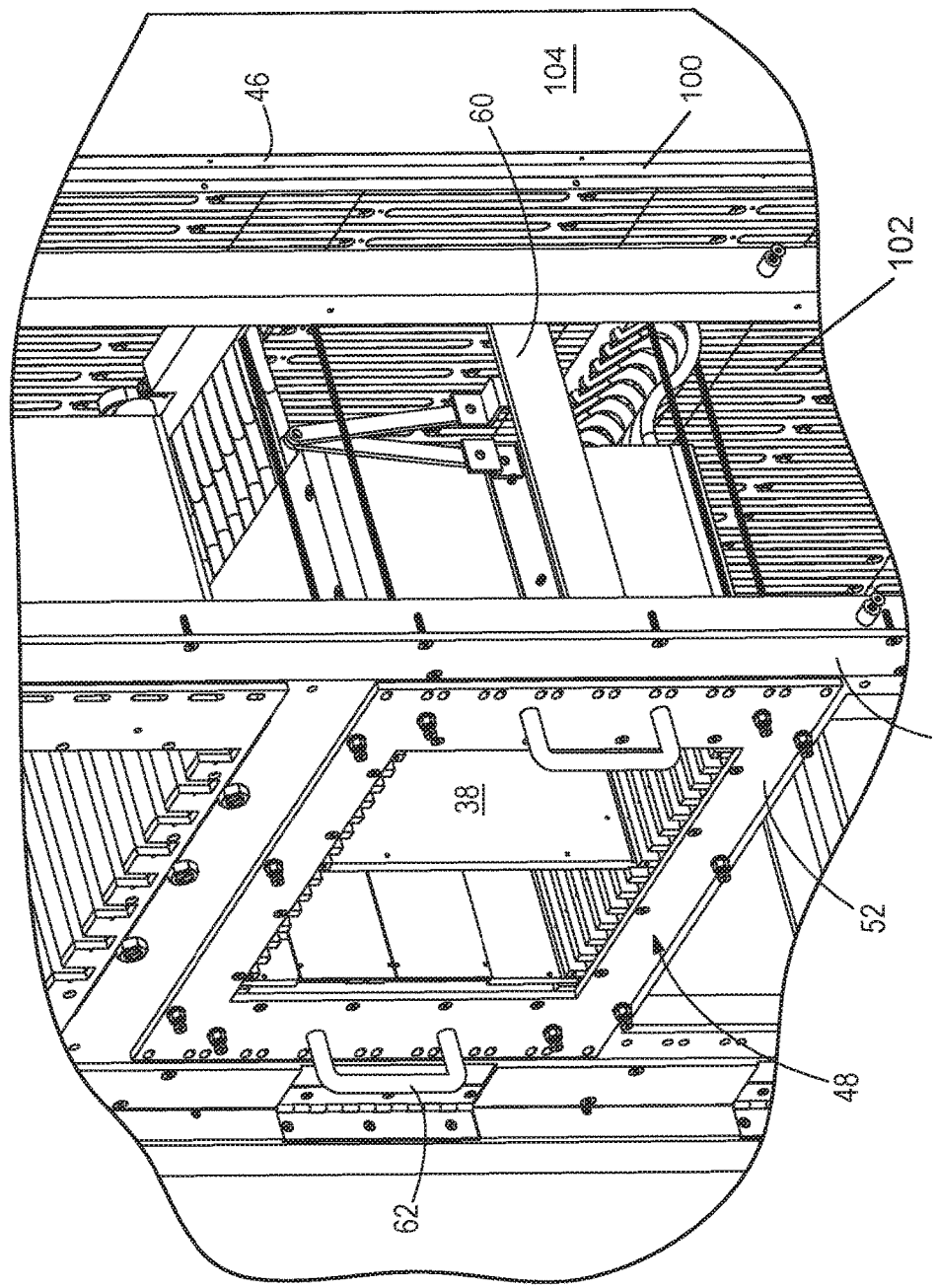
FIG. 2 is an enlarged perspective view of the electronics rack of FIG. 1 showing a lower cage with a portion of the rack removed for clarity.
Figure 3:
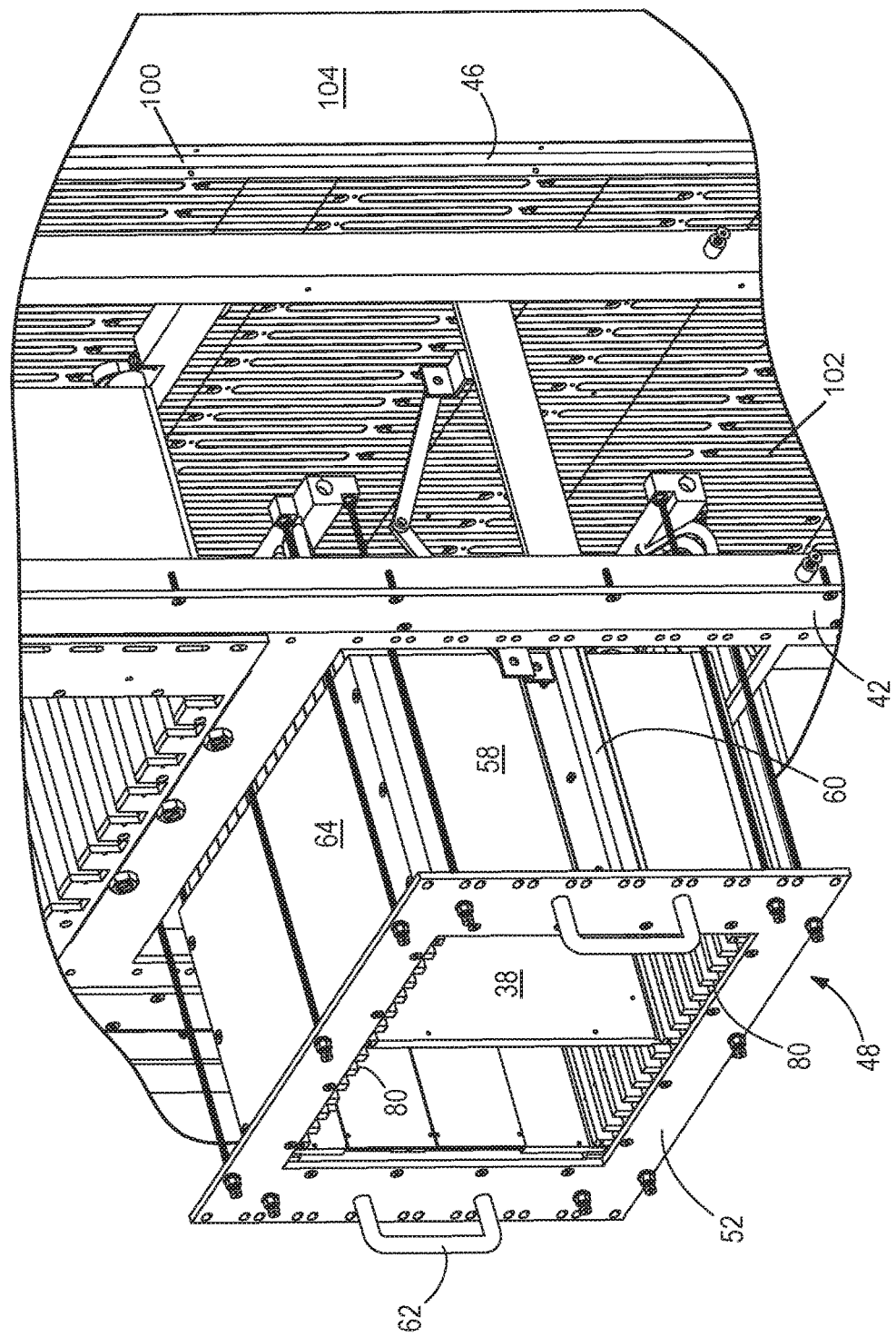
FIG. 3 is the view of FIG. 2 with the lower cage slid to an open position.

Referring to FIGS. 2-8, each of the lower cages 48 includes a front face 52, an upper thermal collector 54, a lower thermal collector 56, and left and right side walls 58 to form a generally box-like arrangement. This box-like arrangement is designed to slide into and out of the frame 42 on drawer slides 60 between a closed position (FIG. 2) and an open position (FIG. 3). Handles 62 on the front face 52 facilitate opening the lower cages 48.

Figure 7:
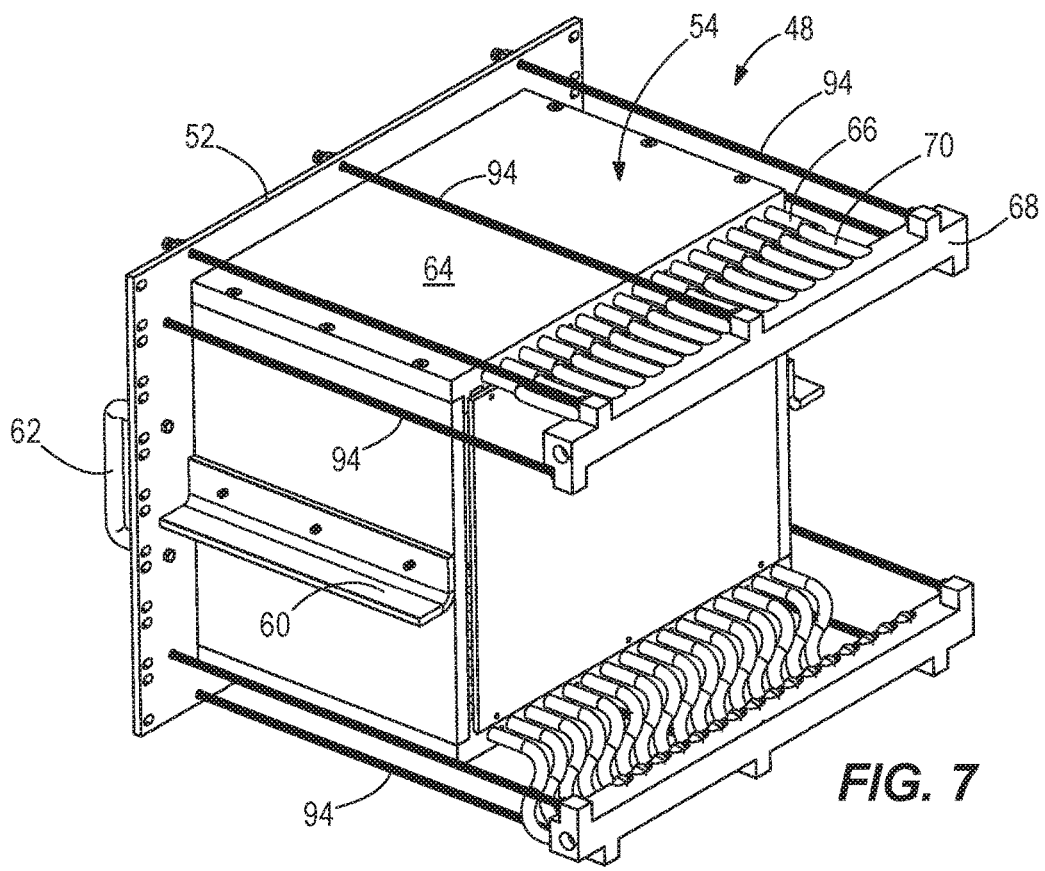
FIG. 7 is a rear perspective view of the lower cage from the electronics rack of FIGS. 1 and 2.
Figure 8:
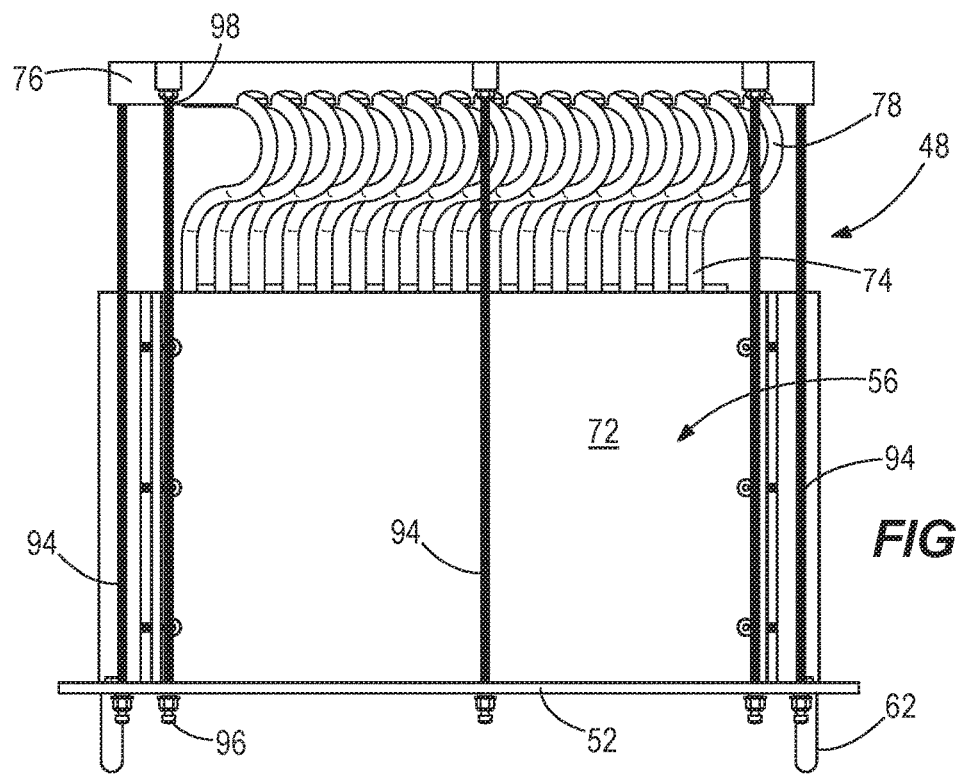
FIG. 8 is a bottom view of the lower cage of FIG. 7.

Referring to FIGS. 4-8, the upper thermal collector 54 includes an upper plate 64, upper heat pipes 66 partially embedded in the upper plate 64, and an upper contact bar 68 attached to distal ends of the upper heat pipes 66. As best shown in FIGS. 7-8, each of the upper heat pipes 66 is essentially identical to the others, and each includes a non-linear portion 70 between the upper plate 64 and the upper contact bar 68. In the illustrated embodiment, the non-linear portion 70 is curved to facilitate flexing of the upper heat pipe 66 in order to change the overall length of the upper thermal collector 54.

Similarly, the lower thermal collector 56 includes a lower plate 72, lower heat pipes 74 partially embedded in the lower plate 72, and a lower contact bar 76 attached to the distal ends of the lower heat pipes 74. As with the upper heat pipes 66, each of the lower heat pipes 74 is essentially identical to each other, and each includes a non-linear portion 78 that is curved to facilitate flexing of the lower heat pipes 74 in order to allow a change in length of the lower thermal collector 56.

As used herein, a "heat pipe" refers to a closed system of heat transfer in which a small amount of liquid within a sealed and evacuated enclosure is cycled through an evaporation and condensation cycle, as is known in the art. Heat entering the enclosure at one location on the casing or "pipe" evaporates liquid at that location, producing vapor which moves to a cooler location on the casing where it is condensed. The movement of the vapor is motivated by a small vapor pressure differential between the evaporator and the condenser locations. The heat transfer is accomplished when the heat of vaporization, which produces the vapor, is essentially moved with the vapor to the condenser location where it is given up as the heat of condensation. In order for the heat transfer to continue, the condensed liquid must be returned from the condenser to the evaporator where it will again be vaporized. Although this return can be accomplished by something as simple as gravity, capillary wicks have generally been used to permit heat pipes to be independent of the effects of gravity. Such a wick extends from a location near the condenser, where the liquid originates, to a location at the evaporator where it is needed for evaporation.

Figure 9:
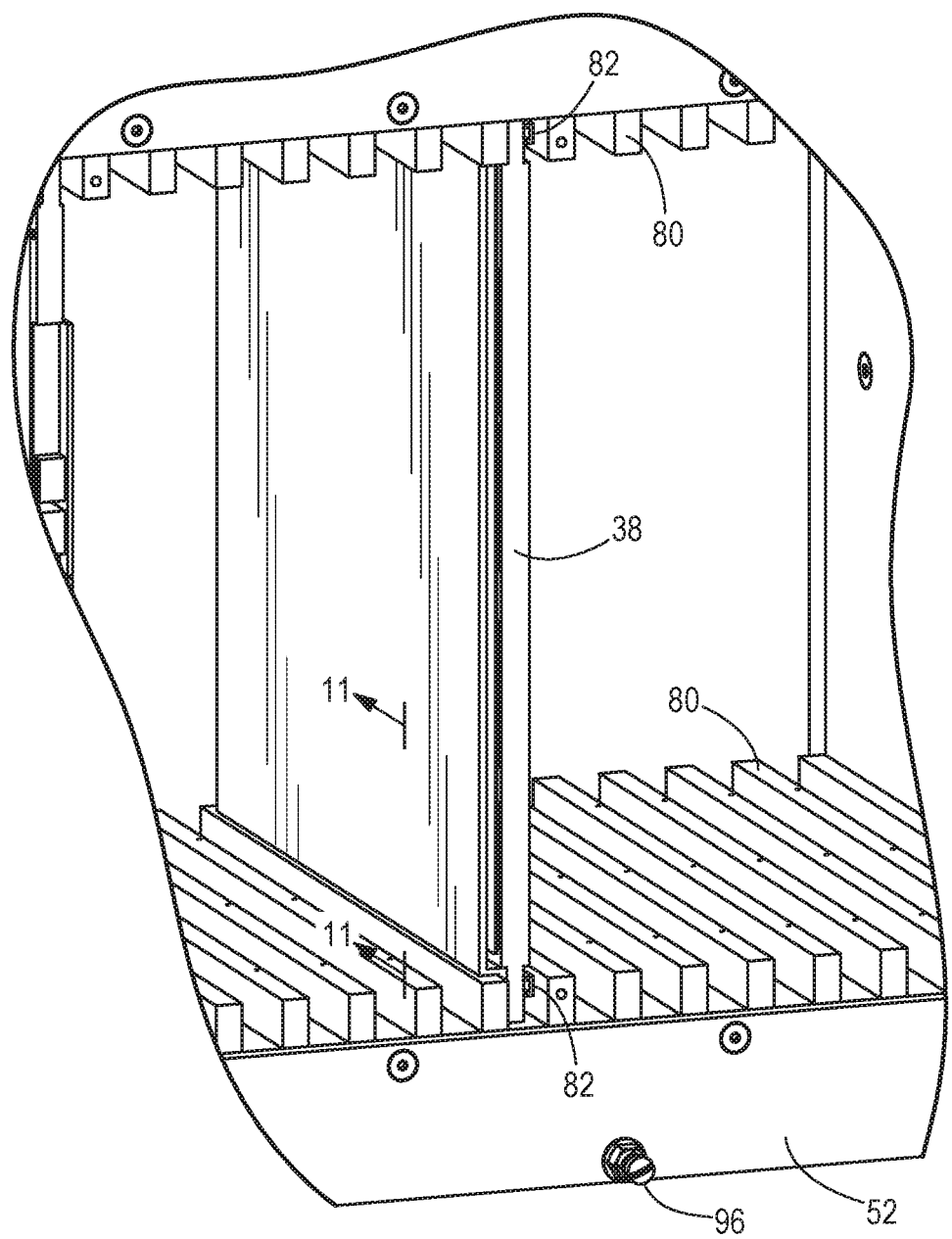
FIG. 9 is an enlarged front view of the cage of FIG. 2 showing a PCB assembly positioned in the cage.

Referring to FIGS. 9-11, a series of cold rails 80 is positioned on a lower surface of the upper plate 64 and on an upper surface of the lower plate 72 to thereby define a series of elongated slots adapted to receive the plurality of PCB assemblies 38. A resilient wedge lock 82 (FIG. 11) is positioned in each slot to secure each of the PCB assemblies 38 in the corresponding slots, as described below in more detail.

Each of the PCB assemblies 38 includes a printed circuit board 84, a primary cold plate 86 and a secondary cold plate 88. As shown in FIGS. 9-11, the primary and secondary cold plates 86,88 sandwich the printed circuit board 84 to facilitate heat transfer from the printed circuit board 84 to the cold plates 86,88. Preferably, the cold plates 86,88 are made from aluminum to enhance the rate of heat transfer. As shown in FIG. 11, each of the PCB assemblies 38 is inserted into a corresponding slot in a lower cage 48 and is held in place by being sandwiched between the corresponding wedge lock 82 and the corresponding cold rail 80.

Each of the lower cages further includes an upper adjuster and a lower adjuster adapted to adjust the length of the upper and lower thermal collectors 54,56, respectively. Referring to FIGS. 7-8, each of the upper and lower adjusters includes five threaded rods 94 connected between the front face 52 and the corresponding contact bar 68,76. The proximate end 96 of each of the threaded rods 94 is keyed for rotation relative to the front face 52. In addition, each proximate end 96 extends slightly from the front face 52 and includes means to facilitate rotation of the threaded rod 94, as shown in FIG. 4. In the illustrated embodiment, the proximate end 96 of each threaded rod 94 is slotted to facilitate insertion of a flathead screwdriver and rotation of the threaded rod 94. The distal end 98 of each of the threaded rods 94 is threaded into a corresponding threaded hole in the corresponding contact bar 68,76. By rotating the threaded rods 94, the position of the corresponding contact bar 68,76 relative to the rear heat sink 46 (and relative to the front face 52) will be adjusted. In the illustrated embodiment, this adjustment can be up to five millimeters of displacement.

Referring to FIGS. 1-3, the rear heat sink 46 includes a rear plate 100 positioned at a rear of the rack 34 in a position where it can be contacted by the contact bars 68,76 upon closing of the lower cages 48 (with appropriate adjustment of the upper and lower adjusters 90,92). The rear heat sink 46 further includes rear heat pipes 102 embedded in the rear plate 100 in order to distribute heat received from the contact bars 68,76 throughout a greater volume of the rear plate 100. The rear heat sink 46 further includes rear fins 104 extending from a rear surface of the rear plate 100 to facilitate passive dissipation of heat to the surrounding air.

In operation, each of the lower cages 48 can be slid out of the rack 34 to facilitate insertion and removal of PCB assemblies 38. After all of the PCB assemblies 38 are properly installed in the corresponding slots, the lower cage 48 can be slid back into the rack 34. However, because of the variability and tolerances of the cabinet 30, it is possible that the upper and lower contact bars 68,76 do not properly engage the rear heat sink 46. Without solid engagement between the contact bars 68,76 and the rear heat sink 46, heat dissipation from the thermal collectors 54,56 to the rear heat sink 46 is substantially compromised. In order to facilitate solid contact between the contact bars 68,76 and the rear heat sink 46, the threaded rods 94 can be rotated to move the contact bars 68,76 from a spaced position (FIG. 5) to a contacting position (FIG. 6) relative to the rear heat sink 46.

Figure 12:
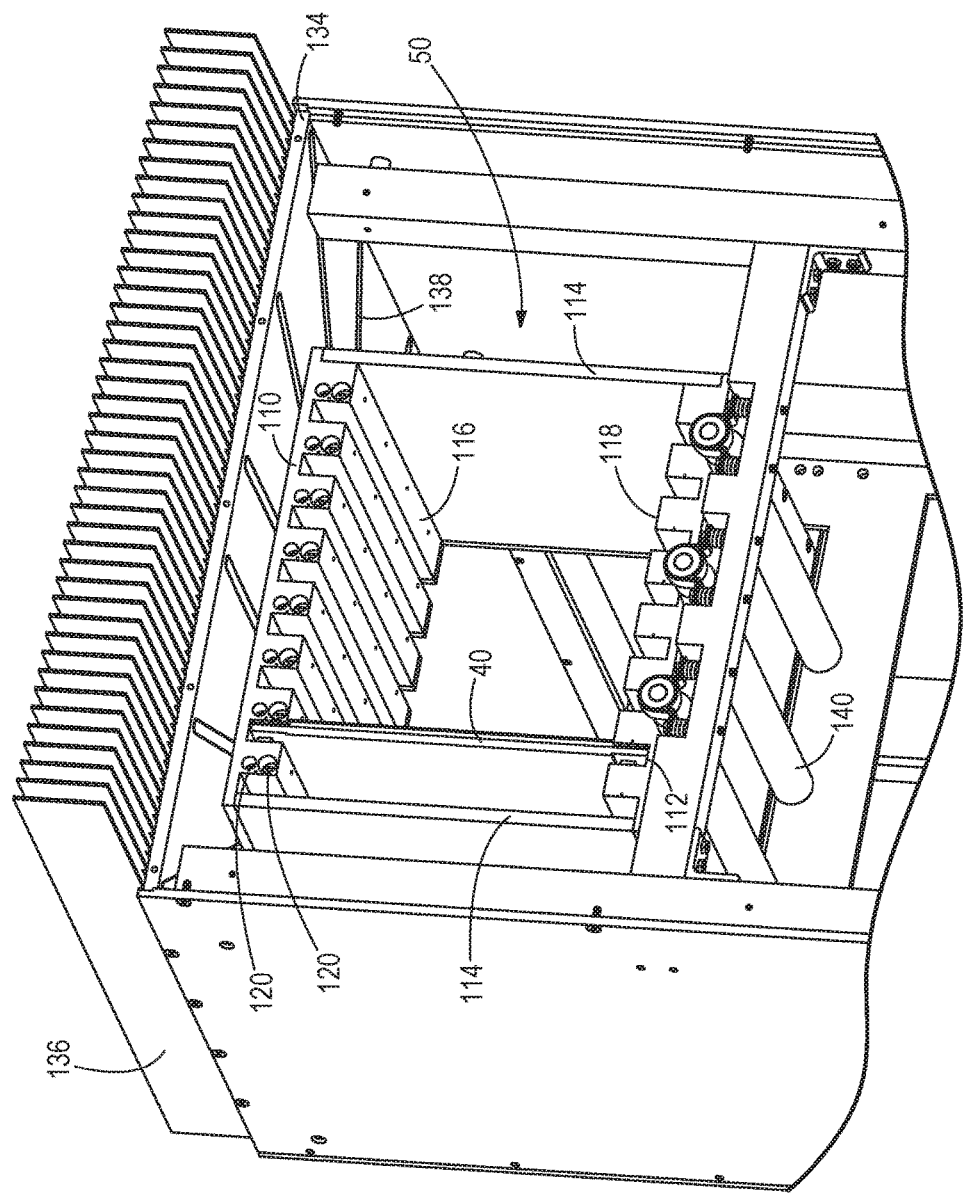
FIG. 12 is an enlarged front perspective view of an upper portion of the electronics rack of FIG. 1 showing an upper cage with portions of the electronics rack removed for clarity.
Figure 14:
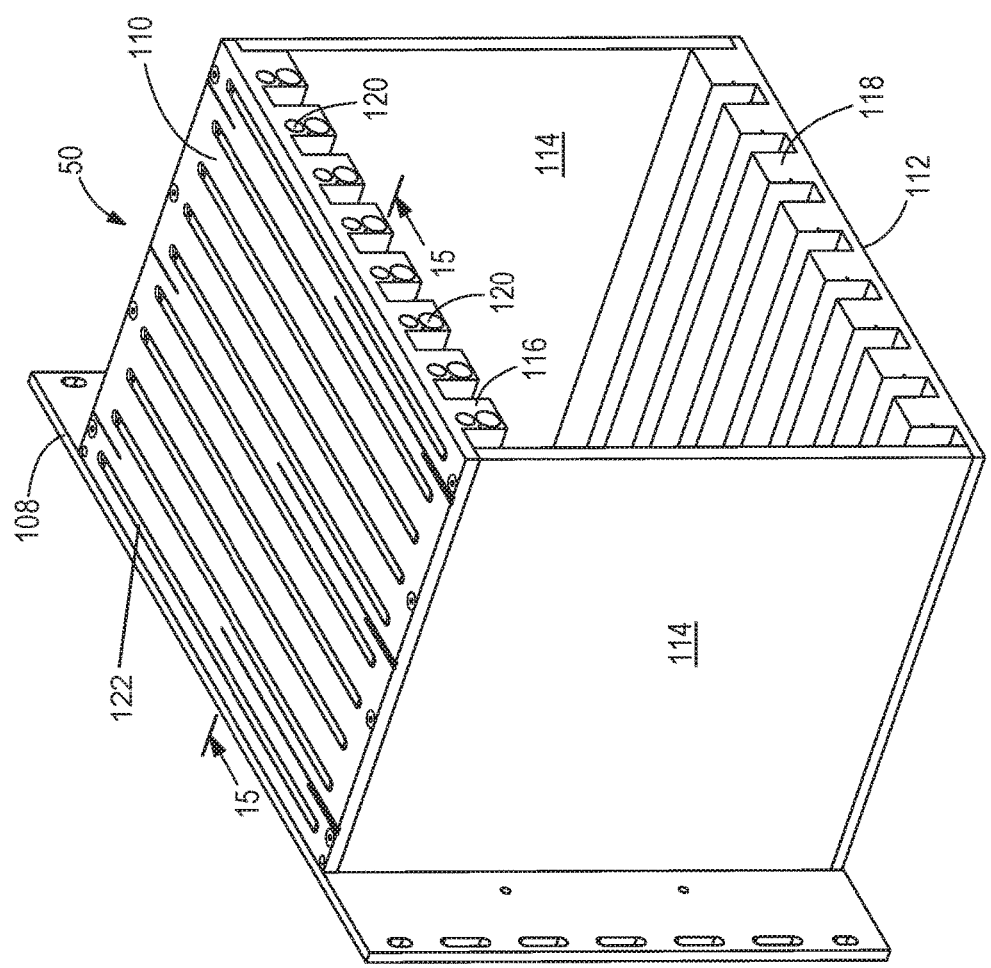
FIG. 14 is a perspective view of the upper cage.
Figure 15:
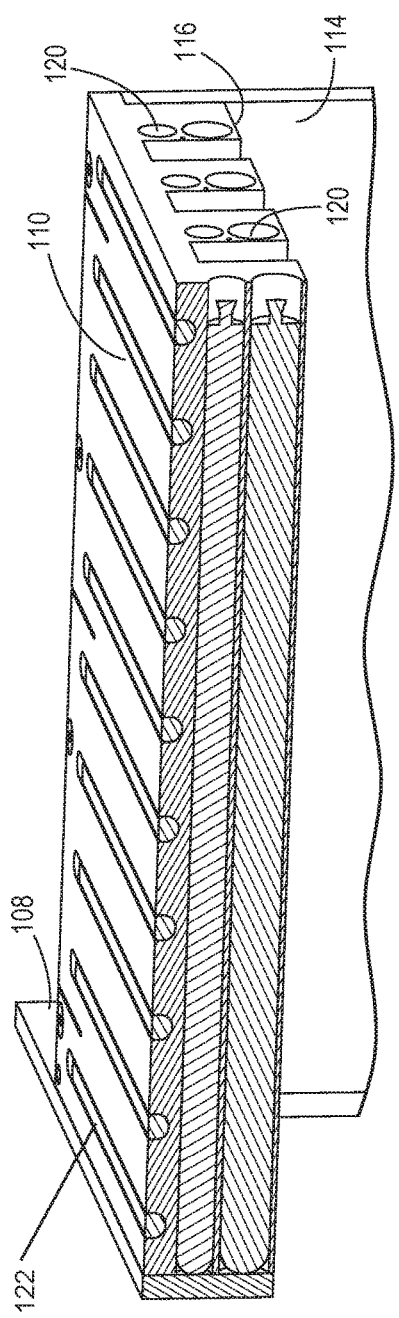
FIG. 15 is a section view of an upper plate from the upper cage taken along line 15-15 in FIG. 14.

Referring to FIG. 12, the upper cage 50 is designed to receive a plurality of power supply assemblies 40 (only one power supply assembly is shown in FIG. 12). The construction and arrangement of the upper cage 50 is slightly different from the lower cages 48 in that the upper cage 50 promotes heat transfer upward, while the lower cages 48 promote heat transfer rearward. The illustrated upper cage 50 includes a front face 108, a top plate 110, a bottom plate 112, and left and right side walls 114 connecting the top and bottom plates 110,112 to form a generally box-like arrangement. As with the lower cages 48, the upper cage 50 includes a series of top and bottom cold rails 116,118 (secured to the top and bottom plates 110,112, respectively) that define slots for receiving the power supply assemblies 40. However, in this arrangement, the top cold rails 116 are different from the bottom cold rails 118. Specifically, as shown in FIGS. 12, 14, and 15, the top cold rails 116 each include two embedded heat pipes 120 for distributing heat in each of the top cold rails 116. In addition, the top plate 110 is different from the bottom plate 112 in that the top plate 110 includes a plurality of embedded heat pipes 122 positioned transverse to the orientation of the top cold rails 116 (see FIGS. 14-15). These transverse heat pipes 122 transfer and distribute heat throughout the top plate 110. For convenience, the combined assembly of the top plate 110 and the top cold rails 116 is referred to as a "cooling brick," it being understood that a cooling brick would not necessarily need to have those components.

As with the lower cages 48, the upper cage 50 includes wedge locks 124 (FIGS. 18-19) positioned in the slots to facilitate securing the power supply assemblies 40 in the slots.

Figure 13:
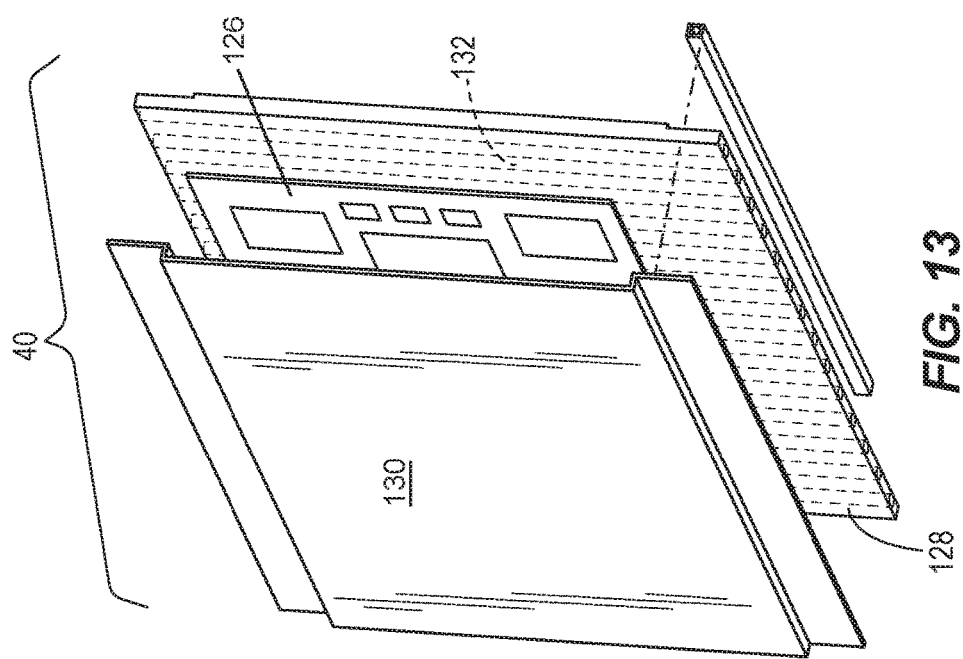
FIG. 13 is an exploded perspective view of a power supply assembly.
Figure 18:
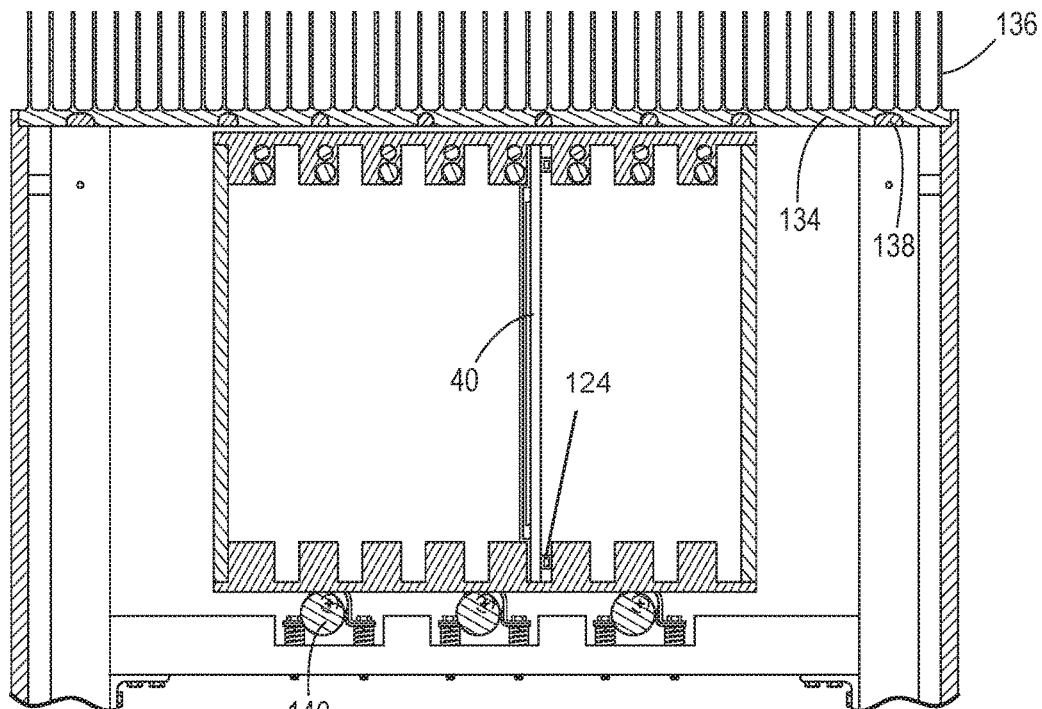
FIG. 18 is a section view of the power supply cage and eccentric cams in a lowered position and taken along line 18-18 in FIG. 17.
Figure 19:
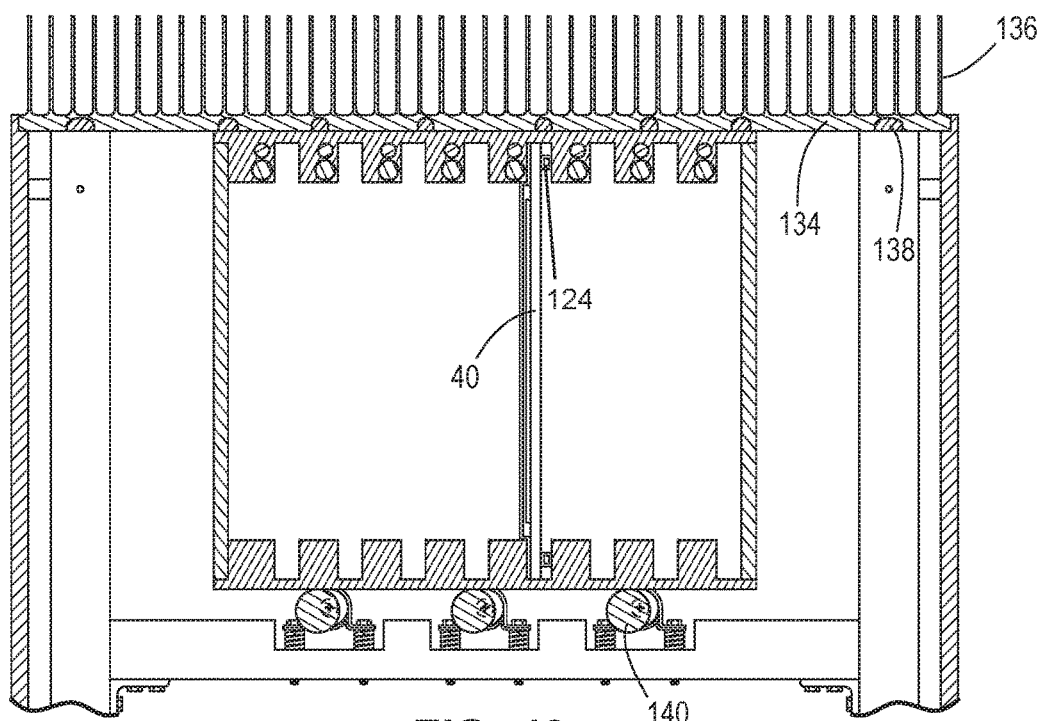
FIG. 19 is the section view of FIG. 18 with the eccentric cams in a raised position.

Similar to the PCB assemblies 38, the power supply assemblies 40 include a power supply board 126, a primary cold plate 128, and a secondary cold plate 130 (see FIG. 13). The power supply board 126 is sandwiched between the primary and secondary cold plates 128,130 to facilitate the transfer of heat from the power supply board 126. Each power supply assembly 40 is designed to be inserted into a pair of opposed top and bottom slots (formed by the top and bottom cold rails 116,118, respectively) and held in place by being sandwiched between the wedge locks 124 and the corresponding top and bottom cold rails 116,118, as shown in FIGS. 18-19.

Referring to FIG. 13, each of the cold plates 86,88,128, 130 can further include heat pipes 132 embedded in the cold plate. In the illustrated embodiment, these heat pipes 132 are only illustrated in connection with the primary cold plate 128 of the power supply assembly. These heat pipes 132 (shown in phantom in FIG. 13) can be positioned to promote the transfer of heat in the desired direction. For example, when used in the PCB assemblies 38 for the lower cages 48, the heat pipes 132 can be arranged to promote heat transfer upward and downward to the upper and lower thermal collectors 54,56, respectively. When used in connection with the power supply assembly 40, the heat pipes 132 can be embedded and positioned to promote transfer of heat upward to the top plate 110 and eventually to the upper heat sink 44.

Figure 16:
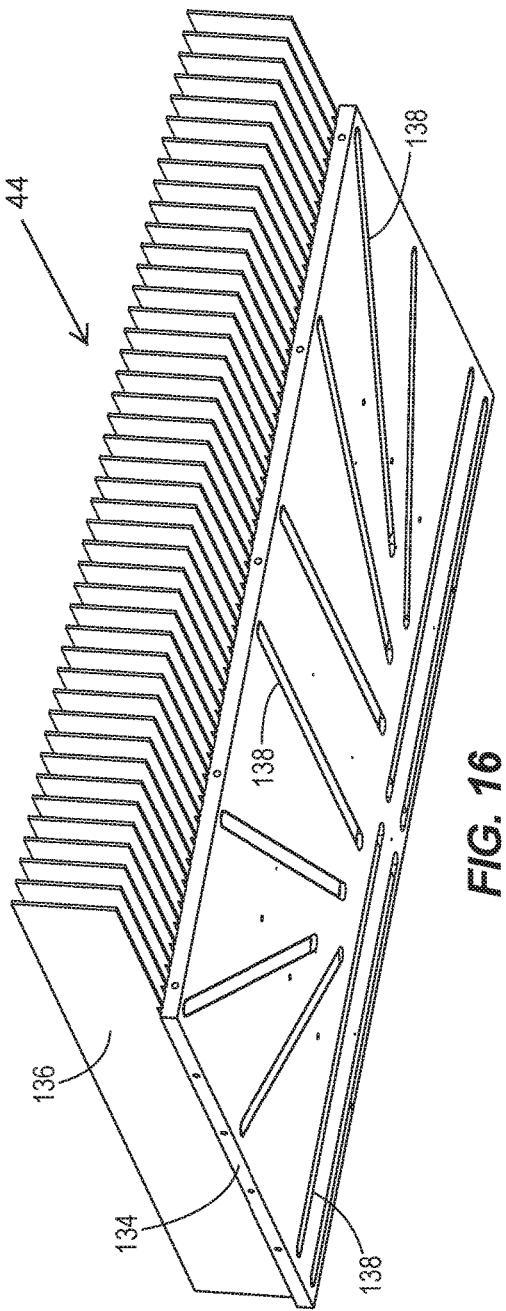
FIG. 16 is a bottom perspective view of an upper heat sink.

Referring to FIG. 16, the upper heat sink 44 includes a distribution plate 134 and a series of upper fins 136 extending upward from the distribution plate 134. The distribution plate 134 is positioned directly above the top plate 110 of the upper cage 50 and includes a series of heat pipes 138 that distribute heat in the distribution plate 134. The illustrated heat pipes 138 are in multiple orientations, such as parallel to the front face 108, perpendicular to the front face 108, and oblique to the front face 108. The illustrated upper fins 136 are arrange parallel to each other and perpendicular to the front face 108.

Figure 17:
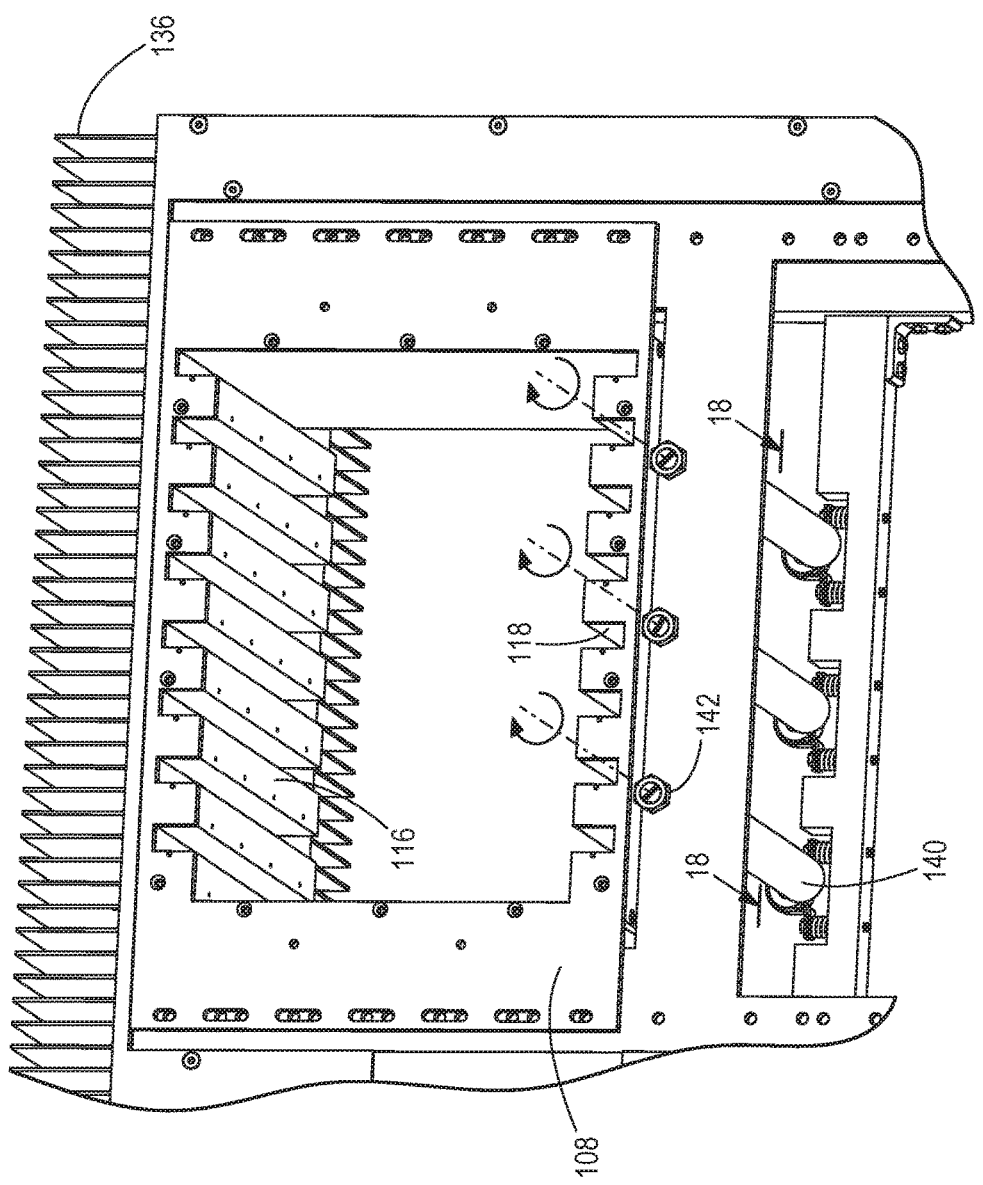
FIG. 17 is a perspective view of a front face of the upper cage and eccentric cams.

The upper cage 50 is designed to have a certain amount of vertical play relative to the frame 42 and relative to the upper heat sink 44. For example, in the illustrated embodiment, the upper cage 50 can be moved vertically about five millimeters relative to the frame 42. This vertical play allows the upper cage 50 to be moved vertically until the top plate 110 of the upper cage 50 contacts the distribution plate 134 of the upper heat sink 44. Referring to FIG. 17, this vertical movement can be accomplished using a series of eccentric cams 140 mounted to the frame 42 and positioned under and in contact with the upper cage 50. As best shown in FIGS. 18-19, rotation of the eccentric cams 140 will cause the upper cage 50 to move upwardly from a lowered position (FIG. 18) to a raised position (FIG. 19) to thereby facilitate the creation of contact between the top plate 110 and the distribution plate 134 of the upper heat sink 44. Each of the eccentric cams 140 includes a cam actuator 142 that extends from a front surface of the frame 42 to facilitate rotation of the eccentric cams 140. In the illustrated embodiment, the cam actuators 142 comprise hex heads that facilitate rotation of the eccentric cams 140 using a standard wrench.

Although the invention has been described in detail with reference to certain preferred embodiments, variations and modifications exist within the scope and spirit of one or more independent aspects of the invention as described.

The invention claimed is:

1. An electronics rack comprising:
   a frame defining a front and rear;
   a first cage adapted to be received in the frame and support a first electronic component, the first cage having a front and a rear, wherein the first cage is movable between a first position and a second position relative to a front of the frame;
   a first thermal collector and a second thermal collector each in thermal communication with the first electronic component, the first and second thermal collectors each having an adjustable length, wherein the first electronic component is disposed between the first and second thermal collectors;
   a first heat sink positioned at the rear of the frame and in thermal communication with the first electronic component via direct physical contact with the first and second thermal collectors when the first cage is in the first position and is out of thermal communication with the first electronic component and out of direct physical contact with the first and second thermal collectors when the first cage is in the second position, wherein the length of each of the first and second thermal collectors is adjustable independent of movement of the first cage in the electronics rack;
a second cage adapted to support a second electronic component and positioned above the first cage; and
a second heat sink separate from the first heat sink and in thermal communication via direct physical contact with the second cage;
wherein the first thermal collector comprises a heat pipe configured to adjust the length of the first thermal collector, and wherein the heat pipe includes a portion that is non-linear in at least one of the first and second positions and that is compliant to adjust the length of the first thermal collector.

2. The electronics rack of claim 1, wherein the first cage is configured for insertion and removal of the first electronic component from the front of the frame.

3. The electronics rack of claim 1, wherein the electronics rack comprises in addition to the first cage and the second cage a plurality of cages each adapted to be received in the frame and support an electronic component, wherein each of the plurality of cages is movable between a first position and a second position relative to the front of the frame, wherein the plurality of cages is arranged in a vertical stack, wherein each cage of the plurality of cages includes a pair thermal collectors, wherein the first heat sink is in thermal communication with each of the pair of thermal collectors when each of the plurality of cages is in the first position and is out of thermal communication with the first electronic device when the first cage is in the second position, wherein the length of each of the pair of thermal collectors is adjustable.

4. The electronics rack of claim 1, where the second cage comprises a cooling brick having a plurality of slots adapted to support upper edges of a plurality of vertically-oriented electronic components, and wherein the cooling brick includes a transverse heat pipe positioned above the plurality of slots.

5. The electronics rack of claim 1, wherein the second heat sink is positioned above the second cage.

6. The electronics rack of claim 1, wherein the first heat sink is substantially vertically-oriented and the second heat sink is substantially horizontally-oriented.

7. The electronics rack of claim 1, wherein the first thermal collector is coupled to and movable with the first cage.

8. The electronics rack of claim 1, where the second cage comprises a cooling brick having a plurality of slots formed by cold rails, wherein the slots are adapted to support upper edges of a plurality of vertically-oriented electronic components, and wherein the cooling brick is movable with the second cage between an open position in which the cooling brick is out of thermal communication with the second heat sink and a closed position in which the cooling brick is in thermal communication with the second heat sink.

9. The electronics rack of claim 8, wherein each cold rail includes an embedded heat pipe and the cooling brick includes at least one other heat pipe extending transverse to each embedded heat pipe in each cold rail.

10. The electronics rack of claim 9, wherein each heat pipe embedded in each cold rail lies in a first plane and the at least one other heat pipes lies in a second plane different from the first plane.

11. The electronics rack of claim 1, wherein the first thermal collector includes a contact bar, and wherein the contact bar is in physical contact with the first heat sink when the first thermal collector is in thermal communication with the first heat sink and the contact bar is out of physical contact with the first heat sink when the first thermal collector is out of thermal communication with the first heat sink.

12. The electronics rack of claim 1, wherein the non-linear portion of the compliant heat pipe is curved to facilitate adjusting the length of the first thermal collector.

13. An electronics rack comprising:
a frame defining a front and a rear;
a cage adapted to be received in the frame and support an electronic component, the cage being movable between an open position toward the front of the frame and a closed position toward the rear of the frame;
a heat sink positioned at a rear of the frame; and
a compliant thermal collector positioned between the cage and the heat sink, wherein the compliant thermal collector is in thermal communication with the electronic component, wherein the compliant thermal collector is configured to be in thermal communication via direct physical contact with the heat sink when the cage is in the closed position to thereby provide thermal communication between the electronic component and the heat sink, and wherein the thermal collector is configured to be removed from thermal communication with and out of direct physical contact with the heat sink when the cage is in the open position; and
a rod extending between a front of the cage and a rear of the compliant thermal connector, wherein movement of the rod adjusts a length of the compliant thermal collector;
wherein the compliant thermal collector comprises a heat pipe configured to adjust the length of the compliant thermal collector, and wherein the heat pipe includes a portion that is non-linear in at least one of the open or closed positions and that is compliant to adjust the length of the compliant thermal collector.

14. The electronics rack of claim 13, wherein the cage is mounted for sliding movement relative to the frame.

15. The electronics rack of claim 13, wherein the cage is configured for insertion and removal of the electronic component from the front of the frame.

16. The electronics rack of claim 13, wherein the cage is one cage of a plurality of cages arranged in a vertical stack, and wherein the heat sink is in thermal communication with the plurality of cages.

17. The electronics rack of claim 13, wherein the compliant thermal collector comprises a heat pipe having a non-linear shape.

18. The electronics rack of claim 17, wherein the non-linear shape includes a curved portion.

19. The electronics rack of claim 17, wherein the heat pipe has a length and wherein the non-linear shape facilitates adjustment of the length.

20. The electronics rack of claim 13, wherein the compliant thermal collector includes a contact bar and a plurality of heat pipes in thermal communication between the electronic component and the contact bar, the contact bar positioned to be pressed into contact with the heat sink when the cage is in the closed position.

21. The electronics rack of claim 13, wherein movement of the rod adjusts a position of the contact bar relative to the cage.

22. The electronics rack of claim 13, wherein the rod is threaded and rotation of the rod adjusts a length of the compliant thermal collector.

23. The electronics rack of claim 13, wherein the compliant thermal collector is coupled to and movable with the cage.

24. The electronics rack of claim 13, wherein the compliant thermal connector includes a contact bar, and wherein the contact bar is in physical contact with the heat sink when the compliant thermal collector is in thermal communication with the heat sink and the contact bar is out of contact with the heat sink when the compliant thermal collector is out of thermal communication with the heat sink.

25. The electronics rack of claim 13, wherein the non-linear portion of the heat pipe is curved to facilitate adjusting the length of the compliant thermal collector.

26. An electronics rack comprising:
a frame defining a front and a rear;
a cage having a front and a rear, wherein the cage is configured to be received in the frame and support an electronic component, the cage being movable between an open position toward the front of the frame and a closed position toward the rear of the frame;
a heat sink positioned at a rear of the frame; and
a thermal collector coupled to and movable with the cage, wherein the thermal collector comprises a compliant heat pipe having a length that is adjustable, and wherein the thermal collector is in thermal communication with the electronic component, the thermal collector being in thermal communication via direct physical contact with the heat sink when the cage is in the closed position to thereby provide thermal communication between the electronic component and the heat sink and the thermal collector being out of thermal communication with and out of direct physical contact with the heat sink when the cage is in the open position;
wherein the compliant heat pipe includes a portion that is non-linear in at least one of the open or closed positions and that is compliant to adjust the length of the thermal collector.

27. The electronics rack of claim 26, wherein the thermal collector comprises a thermal plate in thermal contact with the electronic component, wherein the compliant heat pipe is in thermal communication with the thermal plate and the heat sink, and wherein the compliant heat pipe contains a phase-change working fluid and is configured to transfer heat generated by the electronic component from the thermal plate to the heat sink as a result of evaporation and condensation cycles of the working fluid.

28. The electronic component rack of claim 27, wherein the heat pipe is in thermal communication with a thermal contact bar positioned between the compliant heat pipe and the heat sink such that the thermal contact bar is in thermal communication with the heat sink when the cage is in the closed position to thereby provide thermal communication between the electronic component and the heat sink and the thermal contact bar is removed from thermal communication with the heat sink when the cage is in the open position.

29. The electronic component rack of claim 28, wherein the thermal contact bar is spaced from the thermal plate and the compliant heat pipe is configured to adjust a distance between the thermal plate and the thermal contact bar.

30. The electronics rack of claim 29, wherein the thermal contact bar is in physical contact with the heat sink when the thermal collector is in thermal communication with the heat sink and the thermal contact bar is out of physical contact with the heat sink when the thermal collector is out of thermal communication with the heat sink.

31. The electronics rack of claim 30, wherein the cage is a first cage and the heat sink is a first heat sink, and further comprising:
a second cage adapted to support a second electronic component and positioned above the first cage; and
a second heat sink separate from the first heat sink and in thermal communication with the second cage.

32. The electronics rack of claim 31, wherein the second heat sink is positioned above the second cage and the first heat sink is substantially vertically-oriented and the second heat sink is substantially horizontally-oriented.

33. The electronics rack of claim 32, wherein the second cage comprises a cooling brick having a plurality of slots formed by cold rails, wherein the slots are adapted to support upper edges of a plurality of vertically-oriented electronic components, and wherein the cooling brick is movable with the second cage between an open position in which the cooling brick is out of thermal communication with the second heat sink and a closed position in which the cooling brick is in thermal communication with the second heat sink.

34. The electronics rack of claim 33, wherein each cold rail includes an embedded heat pipe and the cooling brick includes at least one other heat pipe extending transverse to each embedded heat pipe in each cold rail.

35. The electronics rack of claim 34, wherein each heat pipe embedded in each cold rail lies in a first plane and the at least one other heat pipes lies in a second plane different from the first plane.

36. The electronics rack of claim 26, wherein the non-linear portion of the compliant heat pipe is curved to facilitate adjusting the length of the thermal collector.

37. An electronics rack comprising:
a frame defining a front and a rear;
a cage adapted to be received in the frame and support an electronic component, the cage being movable between an open position toward the front and a closed position toward the rear;
a heat sink positioned at a rear of the frame; and
a thermal collector at least partially positioned between the cage and the heat sink and configured to provide thermal communication between the electronic component and the heat sink, the thermal collector including a thermal plate in thermal communication with the electronic component, a compliant heat pipe having an adjustable length in thermal communication via direct physical contact with the thermal plate, and a contact bar in thermal communication via direct physical contact with the heat pipe and positioned between the heat pipe and the heat sink to provide thermal communication between the heat pipe and the heat sink when the cage is in the closed position, wherein the thermal plate, the heat pipe and the contact bar are all movable with the cage into and out of thermal communication with the heat sink;
wherein the compliant heat pipe includes a portion that is non-linear in at least one of the open and closed positions and that is compliant to adjust the length of the thermal collector.

38. The electronics rack of claim 37, wherein the compliant heat pipe is compliant for adjusting a length of the thermal collector independent of the movement of the cage.

39. The electronics rack of claim 38, wherein the thermal collector is coupled to and movable with the cage.

40. The electronics rack of claim 39, wherein the contact bar is in physical contact with the heat sink when the thermal collector is in thermal communication with the heat sink and the contact bar is out of contact with the heat sink when the thermal collector is out of thermal communication with the heat sink.

41. The electronics rack of claim 40, wherein the cage is a first cage and the heat sink is a first heat sink, and further comprising:

a second cage adapted to support a second electronic component and positioned above the first cage; and a second heat sink separate from the first heat sink and in thermal communication with the second cage.

42. The electronics rack of claim 41, wherein the second heat sink is positioned above the second cage and the first heat sink is substantially vertically-oriented and the second heat sink is substantially horizontally-oriented.

43. The electronics rack of claim 37, wherein the non-linear portion of the compliant heat pipe is curved to facilitate adjusting the length of the thermal collector.

* * * * *